United States Patent
Will et al.

(10) Patent No.: US 7,262,814 B2
(45) Date of Patent: Aug. 28, 2007

(54) METHOD AND DEVICE FOR INSTALLING BROADCASTING CHANNELS

(75) Inventors: Patrick Will, Rennes (FR); Philippe Bouvet, Saint Sulpice la Foret (FR)

(73) Assignee: Thomson Licensing, Boulogne-Billancourt (FR)

(*) Notice: Subject to any disclaimer, the term of this patent is extended or adjusted under 35 U.S.C. 154(b) by 430 days.

(21) Appl. No.: 10/496,034

(22) PCT Filed: Nov. 7, 2002

(86) PCT No.: PCT/EP02/12475

§ 371 (c)(1),
(2), (4) Date: May 19, 2004

(87) PCT Pub. No.: WO03/044951

PCT Pub. Date: May 30, 2003

(65) Prior Publication Data
US 2005/0010946 A1    Jan. 13, 2005

(30) Foreign Application Priority Data
Nov. 21, 2001   (FR) .................................. 01 15241

(51) Int. Cl.
*H04N 5/50*   (2006.01)

(52) U.S. Cl. ...................... 348/731; 348/732; 348/733; 348/554; 725/38

(58) Field of Classification Search ........ 348/731–732, 348/725–726, 553–555, 733, 735; 725/38, 725/59, 131; *H04N 5/50*
See application file for complete search history.

(56) References Cited

U.S. PATENT DOCUMENTS

| | | | |
|---|---|---|---|
| 6,421,099 B1 * | 7/2002 | Oh ............................. | 348/732 |
| 6,437,837 B1 * | 8/2002 | Seo ............................ | 348/735 |
| 6,678,012 B1 * | 1/2004 | Belotserkovsky ........... | 348/731 |
| 6,798,463 B1 * | 9/2004 | Sakakibara .................. | 348/732 |
| 7,080,393 B2 * | 7/2006 | Morisada et al. ............. | 725/38 |

FOREIGN PATENT DOCUMENTS

| | | |
|---|---|---|
| WO | 99/54998 | 10/1999 |
| WO | 01/06650 | 1/2001 |

* cited by examiner

*Primary Examiner*—Trang U. Tran
(74) *Attorney, Agent, or Firm*—Joseph J. Laks; Robert D. Shedd; Brian J. Cromarty

(57) ABSTRACT

The invention relates to a device and a method of installing digital or analogue broadcasting channels of a frequency band, each channel being centred on a nominal frequency subject to drift or an offset. In this method,
  each channel is successively installed by searching for it within a nominal capture span centred on the said nominal frequency,
  the channels are sought as a function of installing at least one previous channel.

Application to a digital or analogue receiving device.

9 Claims, 2 Drawing Sheets

METHOD AND DEVICE FOR INSTALLING BROADCASTING CHANNELS

This application claims the benefit, under 35 U.S.C. § 365 of International Application PCT/EP02/12475, filed Nov. 7, 2002, which was published in accordance with PCT Article 21(2) on May 30, 2003 in English and which claims the benefit of French patent application No. 0115241, filed Nov. 21, 2001.

BACKGROUND OF THE INVENTION

1. Field of the Invention

The invention relates to a method and a device for installing digital or analogue broadcasting channels.

More particularly, the invention relates to the field of audio and/or video receiving systems. It especially relates to systems complying with the DVB (acronym for "Digital Video Broadcast") standard. It also relates to analogue receiving systems.

2. Description of Related Art

The installation of a digital decoder requires searching all the available channels that it is desired to install within a given frequency band.

Each channel is centred on a frequency which the demodulator of the installation device tries to capture when installing various channels. However, this central frequency transmitted by the programme broadcaster is subject to variations and is not exactly the frequency received. The variations in frequency are due to various factors and especially to the following factors:

the accuracy of the transmitter, which alters the frequency transmitted with respect to its ideal frequency, the drifts of the various components which alter the frequency received.

When the frequency received is subject to these variations, the demodulator attempts to capture the frequency and risks being unsuccessful, which means that the channel is not installed.

Known devices make it possible to detect the channel even if the frequency is subject to variations. Such devices lock on to the central frequency and attempt to capture it. If they are not successful, that is to say if there was drift, they try to capture the frequencies below the nominal frequency and the frequencies above this nominal frequency within a frequency span centred on the nominal frequency span of the channel and called pick-up or capture span, the length of which is a function of the demodulation component.

However, these devices make the installation very lengthy, which is particularly undesirable for the user who wishes to install a new set of programmes.

SUMMARY OF THE INVENTION

The invention may make it possible to considerably reduce the installation time of sets of programmes when the receiving frequency was subject to drift.

It may be applied to digital receiving systems and to analogue receiving systems. Specifically, in the case of analogue receiving systems, when the channels are adjacent, it is necessary to deliberately offset the nominal frequency in order to detect the channels. The offset of a nominal frequency is then similar to a deliberate frequency drift on the transmission side.

To this end, the invention provides a method of installing digital or analogue broadcasting channels of a frequency band, each channel being centred on a nominal frequency subject to drift or an offset at an effective frequency, in which each channel is successively installed by searching for it within a nominal capture span centred on the said nominal frequency.

According to the invention, the channels are sought as a function of installing at least one previous channel.

The invention takes into account the installation of previous channels, and may make it possible to reduce, or even to considerably reduce, the time for installating channels of the frequency band.

Advantageously, at least one maximum drift of the frequency band is calculated and when a channel is not found within the capture span:

this nominal capture span is offset as a function of the maximum drift, on either side of the nominal frequency of the said channel, thereby obtaining a first and a second offset capture span, the effective frequency of the said channel is found by successively searching the first and the second offset capture spans, the following channels are sought within their respective nominal capture span and, if capture is not successful, the nominal capture span of each of the said following channels is offset in the direction of variation of the common drift estimated from the drift of the said channel that was not found within its nominal capture span, as a function of the maximum drift and the said following channels are sought within their respective offset capture span.

In this way, according to an advantageous form of this embodiment, when capture is unsuccessful for a channel, the capture span is offset on each side of the nominal frequency for this channel and thus two offset capture spans are obtained and the capture frequency is found within one of these spans. The offset capture span in which the capture was made is thus stored and for the channels to be installed following the channel for which the capture was not made, when capture of the nominal frequency was unsuccessful, attempts are then made to capture an offset span in the same direction as the stored offset capture span. Thus, this prevents trying to capture a capture span where capture was not possible, that is to say the upper offset capture span if the demodulator was previously capturing within the lower offset capture span or the lower offset capture span if the demodulator was previously capturing the upper offset capture span since the drift varies in the same direction for both channels.

In a preferred embodiment, when the common drift for one of the said following channels is greater than the maximum value of the nominal capture span and when capture is unsuccessful within the nominal capture span of the said channel, the channels following the said channel are sought solely within their respective offset capture span.

Specifically, once the maximum drift has been calculated, it is possible to determine the channel for which the drift is greater than the maximum value of the capture span. For the channels following this channel, capture is not possible within the nominal capture span since the drifted frequency is no longer located within the nominal capture span and in this case, the demodulator therefore tries directly to capture their respective offset capture span.

In a preferred embodiment, since the channels are broadcast over a network and received by a demodulation system, the maximum drift of each channel is calculated as a function of the parameters of the network over which the broadcasting channels are broadcast and the parameters of the demodulation system, the drift calculated as a function of the parameters of the demodulation system being calculated according to the formula $$\Delta LO = \Delta ref \times \frac{M}{N}$$

where:
ΔLO is the maximum drift of the channel,
Δref represents the accuracy of the local oscillator of the demodulation system,
M is proportional to the frequency received.

Thus, in this embodiment, the various parameters which may introduce a drift in the nominal frequency of the channel to be installed are taken into account in order to obtain the total drift of the respective nominal frequency of the various channels to be installed.

In a first variant, a single maximum drift is calculated for all the channels of the frequency band and the nominal capture span of each channel is offset as a function of the maximum drift.

The calculation of a single maximum drift for the channels to be installed may be made possible by determining the various channels to be installed and their respective nominal frequency. The maximum drift may then be calculated on initializing the system and stored or else it can be recalculated when installing each channel.

In a second variant, a maximum drift is calculated for each channel and the nominal capture span of each channel is offset as a function of its respective maximum drift.

In this variant, it is possible to calculate the maximum drifts when initializing the system and then to offset the capture span of each channel as a function of its respective maximum drift. It is also possible to calculate directly the maximum drift of each channel during its installation.

Advantageously, the single maximum drift calculated for all the channels of the frequency band is the drift of the channel whose nominal frequency is the highest.

Thus, the maximum drift of the frequency band containing the various channels to be installed is certainly calculated. Since the drift calculated as a function of the parameters of the demodulation system is proportional to the frequency, it is possible to calculate a single maximum drift based on the drift of the highest frequency.

The invention also relates to a device for installing digital or analogue broadcasting channels of a frequency band, each channel being centred on a nominal frequency subject to drift or an offset and an effective frequency, the installation device being provided to install each channel successively and comprising means for searching for each channel. According to the invention:

it comprises means for calculating at least one maximum drift of the frequency band and
the means of searching for channels are capable of searching for the channels as a function of the calculation of the maximum drift and of the installation of at least one previous channel, the said device preferably being capable of implementing the method according to any one embodiment of a method according to the invention.

BRIEF DESCRIPTION OF THE DRAWINGS

The invention will be better understood, and other particular features and advantages will become apparent, on reading the following description of exemplary embodiments, taken by way of non-limiting examples, with reference to the appended drawings, among which.

DETAILED DESCRIPTION OF THE INVENTION

Figure 1:
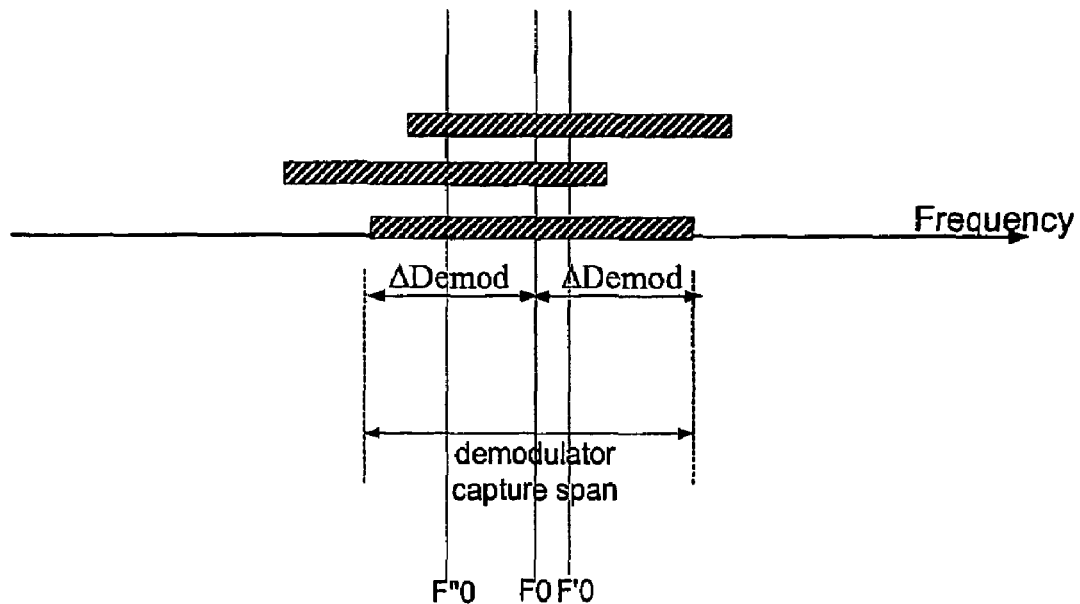
FIG. 1 shows an example of the drift to which the nominal frequency of a channel to be installed was subject.

FIG. 1 shows the drift observed in the frequency on reception in a receiving device such as a set-top box. The accuracy of the transmitter and the deliberate offsets are not shown.

$F_0$ shows the nominal frequency transmitted by the programme broadcaster for the channel 0. This frequency is subject to drift and the receiving device receives a frequency $F'_0$ or $F''_0$, greater or less than $F_0$, respectively.

In a preferred embodiment taken as an example throughout the description, the device according to the invention is incorporated in a demodulation system. This demodulation system may be installed in any digital receiving system such as a set-top box. Such a demodulation device comprises a demodulator and a tuner.

The frequency range on either side of $F_0$ [$F_0-\Delta demod$, $F_0+\Delta demod$] is the nominal capture span over which the demodulator seeks to lock on in order to install the channel 0.

When the nominal frequency $F_0$, also called the capture frequency, is subject to drift, the nominal capture span of the demodulator [$F_0-\Delta demod$, $F_0+\Delta demod$] present in the demodulation system is offset and thus no longer necessarily corresponds to the nominal capture span in which the nominal frequency of the channel is found. Since the size of the capture span of a demodulator is fixed, it is possible that the demodulator cannot install the corresponding channel when the nominal frequency was subject to drift and is no longer within this associated nominal capture span centred on the nominal frequency, the size of which is fixed by the demodulator. For the demodulator, a nominal capture span centred on its nominal capture frequency therefore corresponds to each channel.

Figure 2:
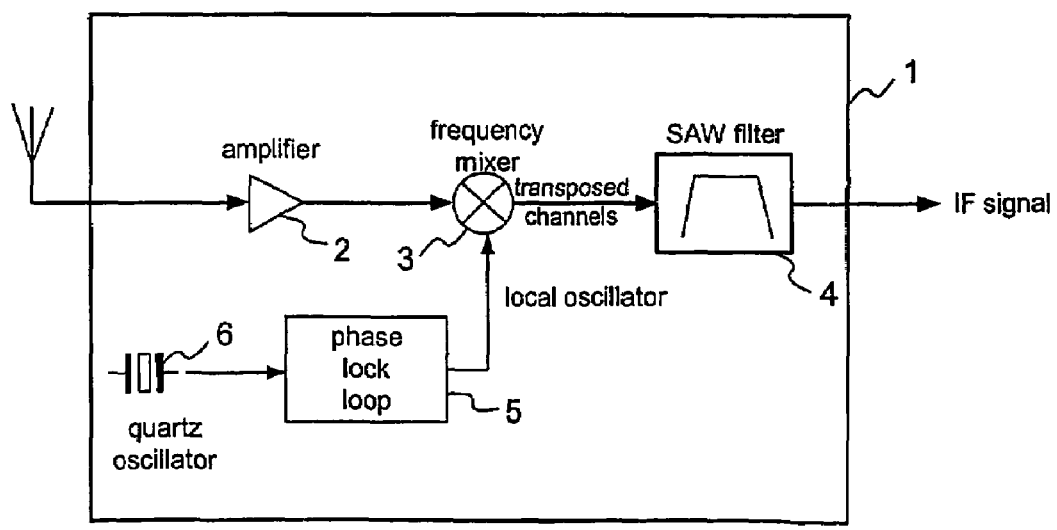
FIG. 2 shows a diagram of a modulation system.

FIG. 2 shows a demodulation system conventionally implemented in a set-top box. At the input, this system receives a radiofrequency (RF) signal coming from a programme broadcaster. This RF signal may be a satellite, terrestrial or cable signal. The system comprises an amplifier 2 responsible for amplifying the received RF signal and a phase lock loop 5. The amplified signal is then frequency transposed, in a mixer 3, with a signal from the phase lock loop 5. The phase lock loop 5 is locked onto the frequency from an oscillator 6. At the output of the mixer 3, the frequency of the input RF signal is transposed and re-enters a surface acoustic wave (SAW) filter.

At the output of the filter 4, an intermediate frequency signal (IF) is obtained.

Before arriving at the demodulation system, the transmitted RF frequency is subject to drift (ΔTx) due to the transmission mode itself. The drift induced in the input RF frequency by the transposition therefore involves a drift in the resulting IF frequency at the input of the demodulation system.

The intermediate IF frequency is also subject to drift induced by the transpostion. This drift is mainly due to the local oscillator. This is because the oscillators have an accuracy which may be high but in general oscillators having very high accuracy are very expensive. Now the price of a demodulation system must be reasonable and the manufacturers therefore often choose oscillators with low accuracy, which leads to a significant drift.

The drift induced by the network is known to the manufacturer of the demodulation system since it is given by the network operator. The drift induced by the oscillator is also known since it is given by the technical specification of the component supplied by the oscillator manufacturer.

The drift of the oscillator has a knock-on effect on the intermediate frequency, according to the following formula:

$$\Delta LO = \Delta ref \times \frac{M}{N}$$

$\Delta LO$ is the drift in the intermediate frequency due to the local oscillator, $\Delta ref$ represents the accuracy of the local oscillator, M is a variable proportional to the RF frequency received, and is therefore a function of the channel that it is desired to demodulate.

M is determined as follows:

$$M = \frac{Freception + IF}{pll\_input\_frequency}$$

Where:

Freception is the frequency transmitted by the transmitter,

IF is the intermediate frequency, pll_input_frequency is the frequency at the input of the phase lock loop, N is a constant which results from the ratio of the frequency of the quartz used to the input of the phase lock loop.

In a particular embodiment, the following values may, for example, be taken:

an oscillator at 4 MHz and a phase lock loop at 166.66 kHz, which gives N equal to 24;

IF=36 MHz;

pll_input_frequency=166 kHz.

In the case of UHF (ultra-high frequency) reception ranging from 474 MHz to 858 MHz, M then varies between 3060 and 5364.

In the case of VHF (very high frequency) reception ranging from 177,5 MHz to 226,5 MHz, M then varies between 1281 and 1575.

The drift $\Delta LO$ of the intermediate frequency due to the local oscillator is therefore also proportional to the RF frequency received.

However, the direction of the drift is not known, that is to say, it is not possible to predict whether the drift frequency is greater or less than the nominal capture frequency.

The total drift to which the intermediate frequency is subject is the sum of $\Delta LO$ and of $\Delta Tx$.

Thus, by determining the maximum drift, it is possible to optimize the installation time. Advantageously, this in fact makes it possible to reduce the installation time by limiting the frequency spans to be scanned.

Figure 3:
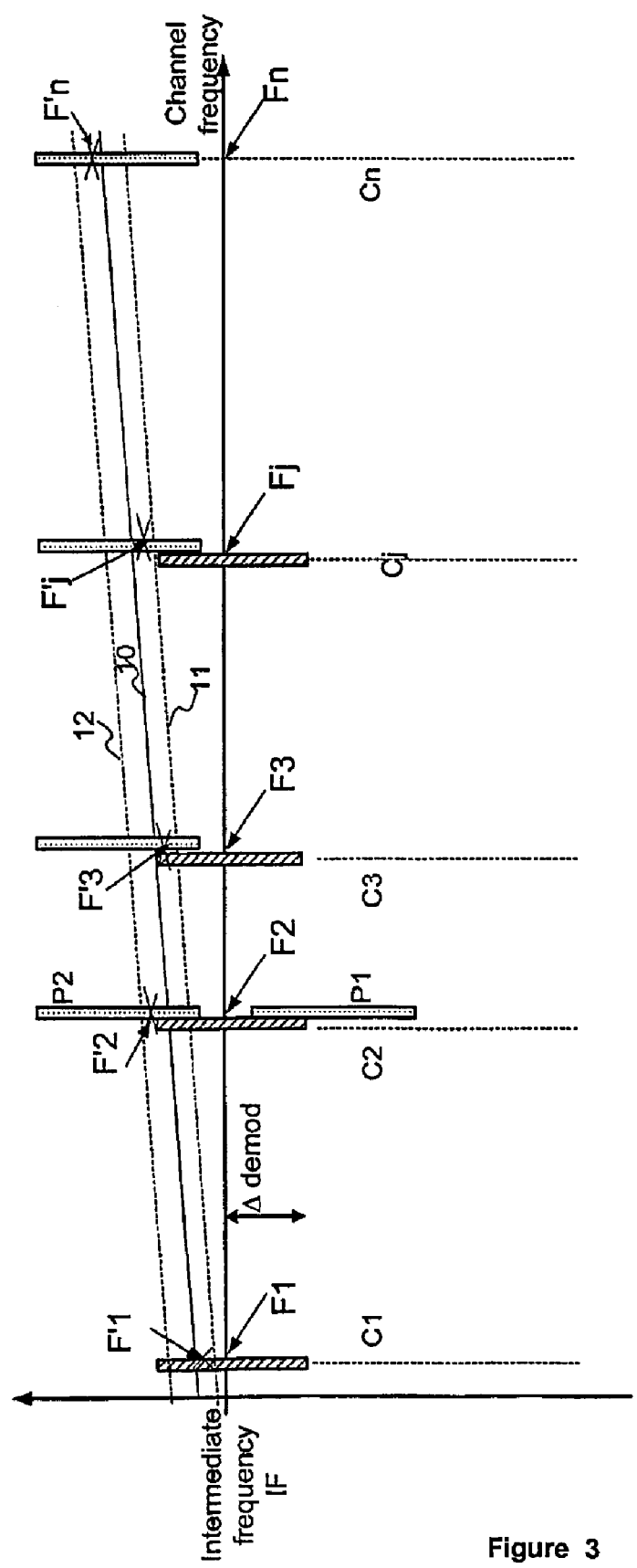
FIG. 3 shows on embodiment of the invention, the hatched bands representing the nominal capture spans and the unhatched bands representing the offset capture spans.

FIG. 3 shows a configuration encountered when installing channels implementing one embodiment of the invention.

The horizontal axis represents the axis of frequencies or channels to be sought in the frequency band and the vertical axis represents the capture span for each channel.

The axis 10 represents the drift $\Delta LO$ introduced by the local oscillator. This example only shows the case where the drift is positive but, as indicated above, it could be negative and the axis 10 would therefore have a negative slope. This axis represents the maximum drift introduced by the local oscillator but this drift could be slightly below this line. This is because the drift due to the local oscillator is often partly associated with conditions of use and sensitive to external parameters associated with temperature, for example.

The axis 12 represents the total drift when the drift introduced by the network is positive and is added to the drift introduced by the local oscillator.

The axis 11 represents the total drift when the drift introduced by the network is negative and is subtracted from the drift introduced by the local oscillator.

The drift is between the axes 12 and 11 for each channel. This is because the channels may be transmitted by different transmitters. Each transmitter has its own accuracy. If all the channels of the same frequency band are installed from the same transmitter, then the drift will be represented by a straight line parallel to the three straight lines shown and contained between the axes 12 and 11. In contrast, when the channels are emitted by different transmitters, the drift is between the two straight lines 12 and 11 but is not linear between the different channels.

C1, C2, C3, Cj, Cn represent the channels which must be installed by the device.

The demodulation system, described in FIG. 2, installs the channels starting with the channel centred on the lowest frequency C1 and finishing with the channel centred on the highest frequency Cn. Several types of installation are known and the embodiment described is applicable to these various types of installation.

Among these, the blind scanning mode is known, in which all the channels contained within the frequency range are sought blindly. The transport installation is also known, in which all the installation parameters are supplied to the set-top box. Finally, the network installation is known, which uses the information supplied in the network signalling tables.

The demodulation system attempts to capture the first channel C1 centred on the intermediate frequency F1. The drift frequency F'1 is located within the nominal capture span of the demodulator associated with the nominal frequency F1 and the demodulator may therefore capture the frequency F'1.

The demodulation system then passes to the channel C2 centred on the frequency F2. The drift to which the frequency F2 is subject is located outside the nominal capture span of the demodulator associated with the frequency F2. In this case, the demodulation system is not able to capture, it then tries to capture within a lower, P1, or higher, P2, frequency span offset with respect to the capture span. The frequency spans P1 and P2 are offset with respect to the capture span so that the maximum value for the upper frequency span and the minimum value for the lower frequency span are equal to the maximum value of the drift. The frequency spans P1 and P2 are called offset capture spans.

The maximum drift may be calculated as indicated above.

According to the embodiment shown in FIG. 3, the maximum drift value for each channel is the same. This represents a simple way of implementing the invention.

According to a variant, it is possible to calculate, for each channel, the maximum drift value, since as indicated above, the drift is proportional to the frequency. This variant requires one calculation for each channel but makes it possible to shorten the installation time since it avoids crossing a frequency band located between the maximum drift of the channel and the maximum drift of the channel of the highest frequency in which the capture frequency cannot be found.

On installation of the channel C2, the drift frequency F'2 is greater than the nominal frequency F2 and the demodulator then succeeds in capturing within the higher offset capture span P2. The modulator stores the fact that it succeeded in capturing within the upper band.

The demodulator then passes to the channel C3 theoretically centred on the nominal frequency F3. The drift frequency F'3 is potentially outside the capture span of the demodulator.

The demodulator takes into account the result of capture of the previous channel which it stored, together with the maximum limit.

When capturing the previous channel C2, the demodulator succeeds in capturing within the upper frequency band.

Now, the drift is much less than the total length of the capture span. Specifically, it is conventional for a demodulator to have a capture span of 50 kHz and the drift is of the order of a few hertz. It is thus noticed that when the drift, for a given channel, is within the upper offset capture span, it cannot be found within the lower offset capture span for the following channels. On capturing the channel C2, the demodulator succeeds in capturing within the upper offset capture span. This means that when installing the channel C3, the demodulator will first of all attempt to capture within the nominal capture span of the channel C3. This is because it is highly possible that the drift will be less for the channel C3, it being possible that the transmitter transmitting the channel C3 is different from the transmitter transmitting the channel C2 and in this case, the drift due to the transmitter may be maximum for the channel C2 and minimum for the channel C3 thereby returning to the nominal capture span of the demodulator associated with the frequency F3.

In FIG. 3, it will be noticed that the drift frequency F'3 is not within the capture span of the channel C3. The demodulator therefore attempts to capture within the upper offset capture span, and succeeds in capturing the frequency F'3.

The demodulator thus continues to install the following channels by attempting to capture over the nominal frequency and when it is unsuccessful, it attempts to capture within an upper offset capture span limited by the value of the maximum drift. Thus, for each channel to be installed after the channel C2, the demodulator decreases the installation time by taking into account the result of the installation of the channel C2 and by only trying to capture within the upper band. Similarly, by having calculated the maximum drift values, the demodulator may offset the nominal capture span optimally by limiting the two offset capture spans by the maximum value and the inverse maximum value of the drift.

The channel j represents the first channel where the value of the minimum drift is greater than the maximum value of the nominal capture span. However, the drift due to the local oscillator represented by the straight line 10 may be slightly different, as indicated above, since this is a maximum drift. It may therefore happen that, for the channel j, the drift is just below the maximum value of the nominal capture span and for this reason, the demodulator must try to capture within the nominal capture span of the demodulator associated with the frequency Fj. In contrast, for the following channels, the minimum drift will be largely greater than the maximum value of the respective nominal capture span of the various channels.

Thus, for the channels to be installed located at frequencies greater than the frequency Fj, the demodulator will no longer try to capture the respective nominal frequencies of the various channels but the drift frequencies by offsetting the frequency band in the direction of the higher frequencies.

On installing the following channels and up to channel n, the highest frequency channel to be installed in the frequency band, the demodulator takes into account the result of installing the channel j. It therefore tries directly to capture a drift frequency located within the upper offset capture span which makes it possible to further reduce the installation time.

The invention claimed is:

1. Method of installing digital or analogue broadcasting channels of a frequency band, each channel being centred on a nominal frequency subject to drift or an offset at an effective frequency, in which each channel is successively installed by searching for it within a nominal capture span centred on the nominal frequency wherein:

the channels are sought as a function of installing at least one previous channel, at least one maximum drift of the frequency band is calculated and when a channel is not found within its nominal capture span:

this nominal capture span is offset as a function of the maximum drift, on either side of the nominal frequency of the channel, thereby obtaining a first and a second offset capture span, the effective frequency of the channel is found by successively searching the first and the second offset capture spans, the following channels are sought within their respective nominal capture span and, if capture is not successful, the nominal capture span of each of the following channels is offset in the direction of variation of the common drift estimated from the drift of the channel that was not found within its nominal capture span, as a function of the maximum drift and the following channels, are sought within their respective offset capture span.

2. Method according to claim 1, wherein when the common drift for one of the following channels is greater than the maximum value of the nominal capture span and when capture is unsuccessful within the nominal capture span of the channel, the channels following the channel are sought solely within their respective offset capture span.

3. Method according to claim 1, wherein since the channels are broadcast over a network and received by a demodulation system, the maximum drift of each channel is calculated as a function of the parameters of the network over which the broadcasting channels are broadcast and the parameters of the demodulation system, the drift calculated as a function of the parameters of the demodulation system being calculated according to the formula;

$$\Delta LO = \Delta ref \times \frac{M}{N}$$

where:

$\Delta LO$ is the maximum drift of the channel, $\Delta ref$ represents the accuracy of the local oscillator of the demodulation system, M is proportional to the frequency received.

4. Method according to claim 1, wherein a single maximum drift is calculated for all the channels of the frequency band and the nominal capture span of each channel is offset as a function of the maximum drift.

5. Method according to claim 4, wherein the single maximum drift calculated for all the channels of the frequency band is the drift of the channel whose nominal frequency is the highest.

6. Method according to claim 1, wherein a maximum drift is calculated for each channel and the nominal capture span of each channel is offset as a function of its respective maximum drift.

7. Method according to claim 1, wherein the nominal capture span is offset on either side of the nominal frequency so that the upper frequency of the upper offset capture span is equal to the maximum drift and the lower frequency of the lower offset capture span is equal to the inverse maximum drift.

8. Device for installing digital or analogue broadcasting channels of a frequency band, each channel being centred on a nominal frequency subject to drift or an offset and an effective frequency, the installation device being provided to install each channel successively and comprising means for searching for each channel, being wherein:

the means of searching for channels are capable of searching for the channels as a function of the calculation of the maximum drift and of the installation of at least one previous channel, the device preferably being capable of implementing the method according to claim 1.

9. Digital receiving device, preferably a set-top box or digital decoder, wherein it comprises a device according to claim 8.

* * * * *